United States Patent [19]

Saito

[11] Patent Number: 4,636,752
[45] Date of Patent: Jan. 13, 1987

[54] NOISE FILTER
[75] Inventor: Yasuaki Saito, Kyoto, Japan
[73] Assignee: Murata Manufacturing Co., Ltd., Nagaokakyo, Japan
[21] Appl. No.: 742,968
[22] Filed: Jun. 10, 1985
[30] Foreign Application Priority Data
   Jun. 8, 1984 [JP] Japan .............................. 59-85981[U]
[51] Int. Cl.⁴ ............................................. H03H 7/09
[52] U.S. Cl. ..................................... 333/12; 333/177; 333/181; 333/185
[58] Field of Search ................... 333/1, 12, 100, 24 R, 333/24 C, 181–185, 81 R, 177; 336/212, 214, 223, 83, 175

[56] References Cited
U.S. PATENT DOCUMENTS

| | | | |
|---|---|---|---|
| 3,516,026 | 6/1970 | Curran et al. ................... | 333/185 X |
| 3,697,804 | 10/1972 | Anderson et al. .............. | 333/181 X |
| 4,314,213 | 2/1982 | Wakino ........................... | 333/184 X |
| 4,320,364 | 3/1982 | Sakamoto et al. .............. | 333/185 X |
| 4,455,545 | 6/1984 | Shelly .............................. | 336/223 |
| 4,519,664 | 5/1985 | Tillotson ........................ | 333/12 X |

Primary Examiner—Marvin L. Nussbaum
Attorney, Agent, or Firm—Wenderoth, Lind & Ponack

[57] ABSTRACT

A noise filter for suppressing radiation noises leaking from a signal transmission cable and comprising combination of flat cable segments with a magnetic material core, the magnetic material core being provided with a pair of slits extending in parallel to each other, the flat cable segments each being bent in a U-like shape and inserted at both ends into the slits, so that a noise filter is formed of the magnetic material core fixed to the flat cable segments and both ends of each flat cable segment projecting from one side surface of the magnetic material core are connected to a printed substrate or the like, whereby the flat cable segments as a whole serve as a common mode coil to suppress leakage of noise.

3 Claims, 8 Drawing Figures

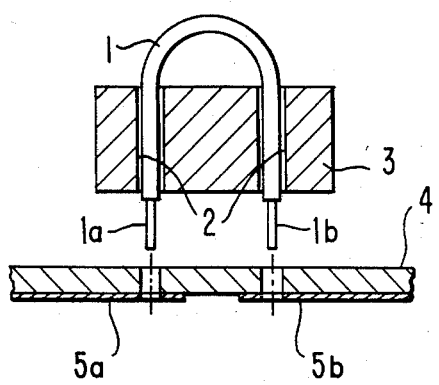
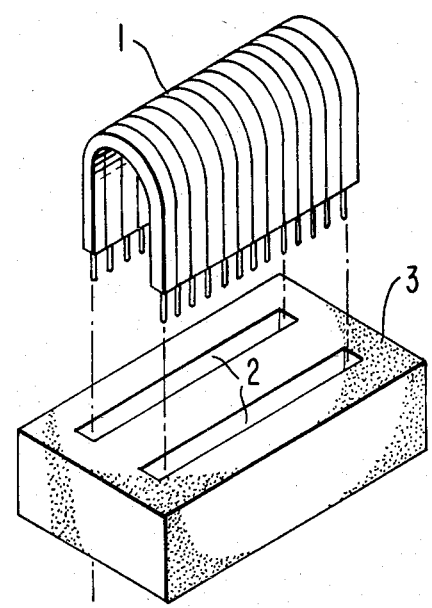
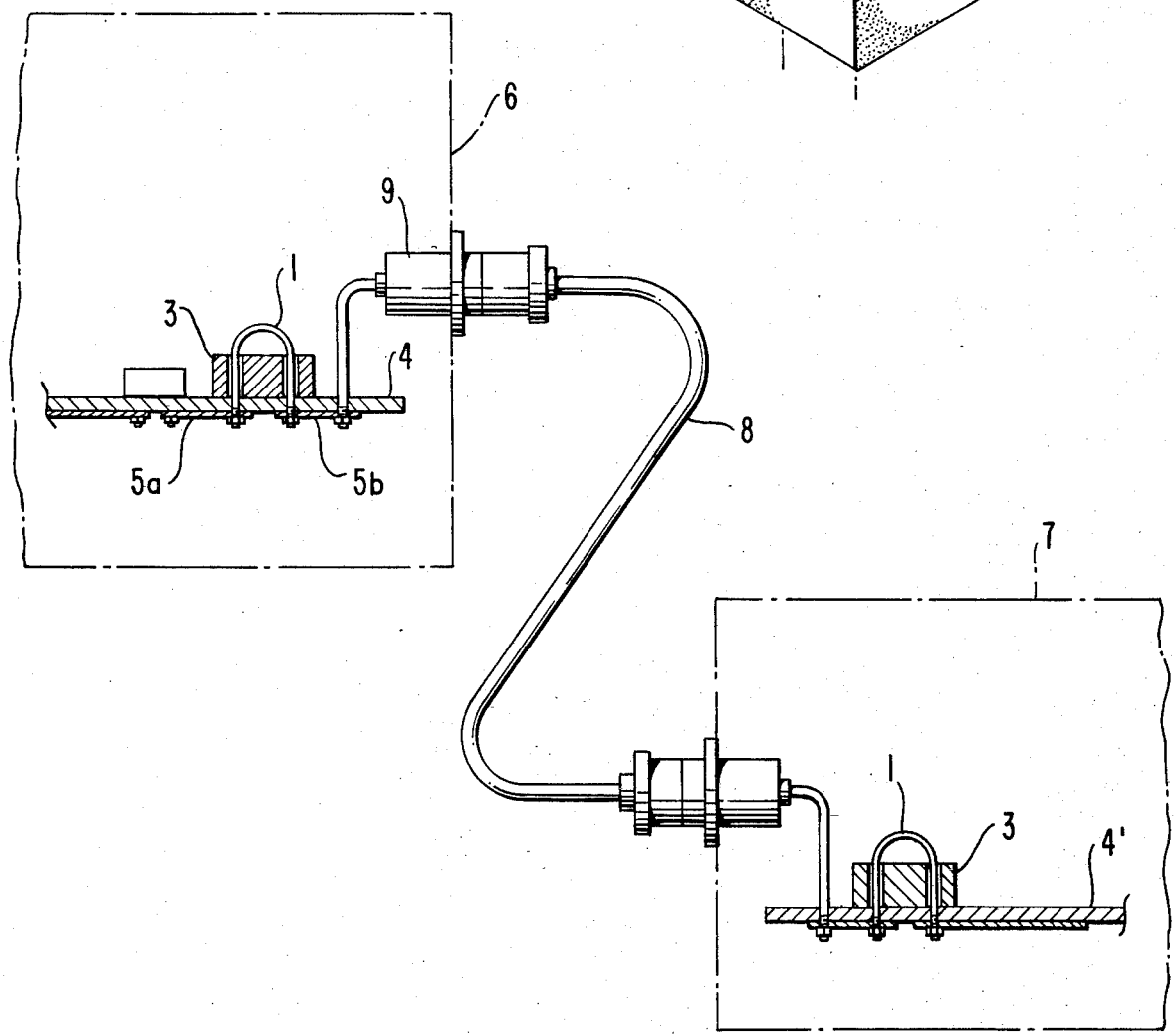

4,636,752

NOISE FILTER

BACKGROUND OF THE INVENTION

This invention relates to a noise filter for suppressing radiation noises or the like leaking from a signal transmission cable, such as an interface cable, connecting a computer body and terminal units respectively.

As shown in FIG. 7, the conventional interface cable 8 for connecting a computer body 6 and a terminal unit 7 functions as an antenna for noises leaking from the computer body 6, thereby causing useless radiation.

Hence, it has hitherto been carried out that the interface cable 8, as shown in the same drawing, perforates through a ring 11 of magnetic material, such as ferrite, to apply an inductance component to the cable as a whole, thereby suppressing the useless radiation.

The magnetic material ring 11, however, is free with respect to the cable 8 so as to be difficult to be fixed thereto. For example, as shown in FIG. 8, the cable 8 once circles the wall of ring 11 axially thereof to thereby fix the ring 11 to the cable 8. Such fixing method is not easy and takes much time.

Also, the magnetic material ring 11, which is externally mounted when in use, is prone to hitting a foreign object leading to breakage.

An object of the invention is to provide a noise filter which can extremely simply fixedly support a magnetic material core.

Another object of the invention is to provide a noise filter which can house the magnetic material core in an apparatus so as to protect that the core from being broken due to an external force.

Still another object of the invention is to provide a noise filter easy to assemble even when having a number of lines, and which need not be subjected to any particular insulating process.

These and other objects of the invention will become more apparent in the detailed description of the preferred and embodiments which follow.

BRIEF DESCRIPTION OF THE DRAWINGS

FIG. 1 is a perspective exploded view of an embodiment of a noise filter of the invention, FIG. 2 is a longitudinal sectional view of the FIG. 1 embodiment, FIG. 4 is a schematic structural view exemplary of the use of the noise filter in FIG. 1.

DETAILED DESCRIPTION OF THE PREFERRED EMBODIMENTS

In FIGS. 1 and 2 showing construction of a noise filter of the invention, the noise filter comprises combination of: flat cable segments 1 comprising a plurality of core wires juxtaposed side-by-side at predetermined spaced intervals and each coated by flexible insulating material; and a core 3 of magnetic material, such as ferrite, having a pair of slits extending in parallel to each other and insertably supporting the flat cable segments 1 respectively; the flat cable segments 1 each projecting at both end lead terminal groups 1a and 1b from one side surface of the magnetic material core 3.

Figure 3:
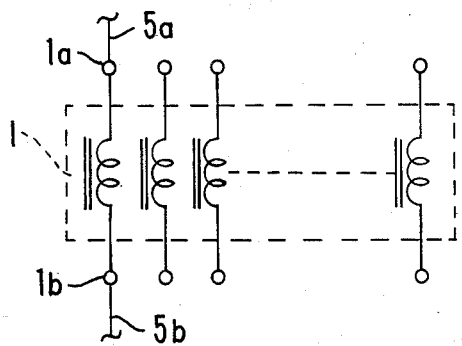
FIG. 3 is an equivalent circuit of the same.

The lead terminal groups 1a and 1b projecting from the core 3 are inserted into, for example, a printed substrate 4 as shown in FIG. 4 to connect with line pattern groups 5a and 5b so that the flat cable segments 1 as a whole become common mode coils in the equivalent circuits as shown in FIG. 3, thereby raising impedance due to an inductance component with respect to noises and suppressing leakage of noise to a cable 8.

Also, the flat cable segments 1, which connect to the printed substrate 4, allow the magnetic material core 3 to be fixed thereto through part of each flat cable segment.

The magnetic material core 3 having the pair of slits 2 is a single body, which may alternatively be a pair of E-like-shaped cores abutting against each other, or in combination of an E-like-shaped core with an I-like-shaped one.

Also, when the slits 2 at the magnetic material core 3 are filled with adhesive resin, the core 3 is securable easily and reliably with respect to the flat cable segments 1.

FIG. 4 is a structural view exemplary of the noise filter when used for suppressing noises generated at the interface line between a computer body 6 and a terminal unit 7. In this case, it is desirable to keep a distance between a connector 9 for the interface cable 8 and the line pattern 5b as small as possible.

When a printed substrate 4' at each terminal unit 7 in FIG. 4 is provided with a noise filter of construction the same as the invention, leakage of noise is more efficiently suppressed.

Figure 5:
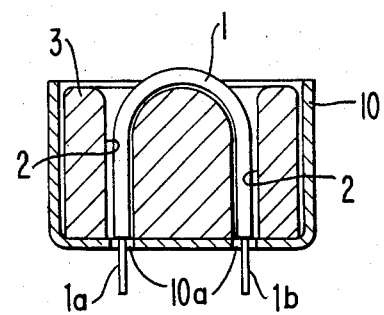
FIG. 5 is a longitudinal sectional view of a modified embodiment of the invention.
Figure 7:
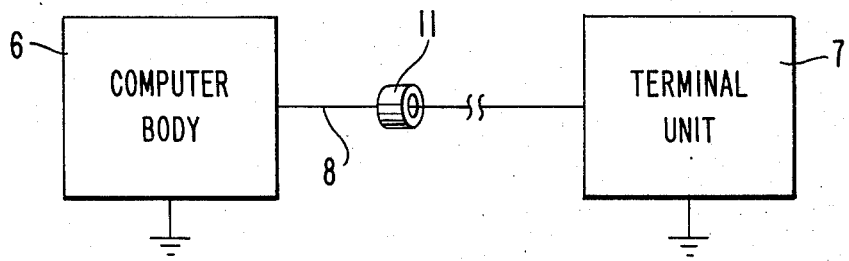
FIG. 7 is a schematic view explanatory of conventional noise suppressing means.
Figure 6:
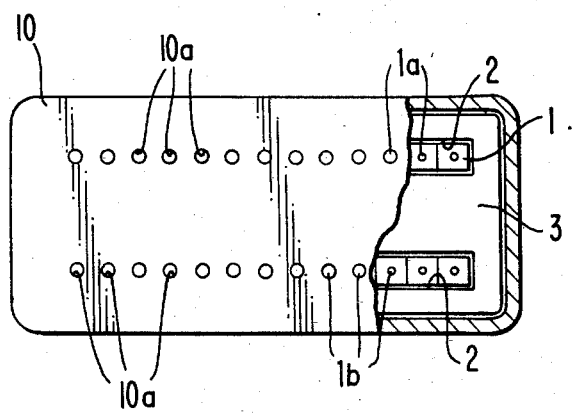
FIG. 6 is a partially cutaway bottom view of the FIG. 5 embodiment.
Figure 8:
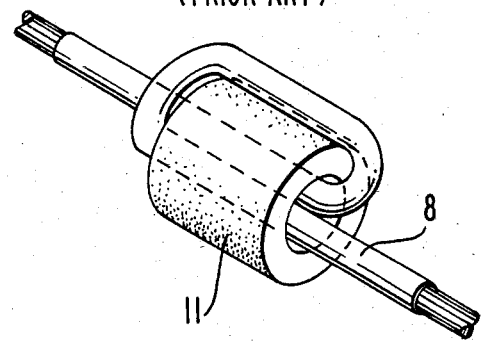
FIG. 8 is a structural view of a magnetic material ring of the conventional noise suppressing means.

Furthermore, in order to facilitate packaging of the noise filter on the printed substrate 4, a casing 10, as shown in FIGS. 5 and 6, is previously assembled with the noise filter, the casing 10 being made of plastic or the like and having a plurality of bores 10a through which the lead terminal groups 1a and 1b project outwardly from the bottom of case 10, so that it is preferable that both the lead terminal groups 1a and 1b are drawn out from the respective bores 10a at the bottom of casing 10, thereby defining pitches of the lead terminal groups 1a and 1b.

In this case, the pitch of the lead terminals at the flat cable segments 1, when set to the standard pitch for an IC of the dual-in-line type, is very convenient for packaging.

Furthermore, the noise filter of the invention, other than being packaged directly onto the printed substrate as shown, may alternatively be mounted thereon through a connector on the cable.

As seen from the above, this invention allows the magnetic material core to be fixedly positioned by the flat cable segments to thereby constitute the noise filter with ease.

Also, since the noise filter can be housed in the apparatus, there is no fear that the magnetic material core is subjected to an external force leading to breakage. Moreover, since the noise filter utilizes flat cable segments, it can be easily assembled even with a large number of lines.

Also, since the magnetic material core is insertably supported through the flat cable segments, the core can be molded integrally without being separated as an EI or EE core. In such a case, no core gap exists to thereby eliminate instability of inductance caused by variation of the core gap.

Also, the use of flat cable segments ensures electrical insulation between the respective lines, or between the lines and the core, whereby the particular insulating processing for a bobbin or the like is not required.

Although several embodiments have been described, they are merely exemplary of the invention and not to be constructed as limiting, the invention being defined solely by the appended claims.

What is claimed is:

1. A noise filter device, comprising:
   a plurality of side-by-side flat cable segments bent in the shape of a U, each cable segment having a lead terminal at opposite free ends thereof so as to define first and second groups of parallel lead terminals, the first and second groups being respectively defined on opposite sides of the U;
   a magnetic core having formed therein a first slit and a second slit parallel to said first slit, extending from one side of said core to another side of said core, said cable segments extending through said first slit and said second slit such that said first group of lead terminals project outwardly of said one side of said core from said first slit and said second group of lead terminals project outwardly of said one side from said second slit; and
   a casing at least partially surrounding said core, having a bottom located along said one side of said core, said casing having a plurality of individually spaced apart bores of predetermined spacing, respectively guiding each of said lead terminals in spaced relation outwardly of said bottom.

2. A noise filter according to claim 1, wherein said magnetic core is formed of a pair of cores in combination.

3. A noise filter according to claim 1, wherein said first and second slits are filled with adhesive resin.

* * * * *